United States Patent [19]

Bodine

[11] Patent Number: 4,758,091
[45] Date of Patent: Jul. 19, 1988

[54] PATTERN GENERATOR PART HOLDER

[75] Inventor: Jonathan A. Bodine, Portland, Oreg.

[73] Assignee: Ateo Corporation, Beaverton, Oreg.

[21] Appl. No.: 933,461

[22] Filed: Nov. 20, 1986

[51] Int. Cl.$^4$ .............................................. G01B 9/02
[52] U.S. Cl. ..................................... 356/358; 355/53; 356/363
[58] Field of Search .................. 356/358, 363; 355/53; 33/1 M

[56] References Cited

U.S. PATENT DOCUMENTS

| | | | |
|---|---|---|---|
| 3,786,332 | 3/1969 | Hepner et al. | 356/363 X |
| 4,383,757 | 5/1983 | Phillips | 250/201 X |
| 4,534,047 | 8/1985 | Deschenaux et al. | 350/318 X |
| 4,655,594 | 4/1987 | Wittekoek et al. | 356/363 |
| 4,659,225 | 4/1987 | Takahashi | 356/363 X |

Primary Examiner—Davis L. Willis
Assistant Examiner—Matthew W. Koren
Attorney, Agent, or Firm—Blakely, Sokoloff, Taylor & Zafman

[57] ABSTRACT

The present invention provides a part holder for use in a pattern generation apparatus having a reference point which has a constant spatial relationship between itself and a work piece mounted on the part holder. The part holder is comprised of a material having a low coefficient of thermal linear expansion. In one embodiment, the part holder is formed in sections combined with bonding using a suitable adhesive, such as a low out-gassing epoxy. However, single piece construction may be utilized. In order to eliminate variations in the spatial relationship between the part holder and a coordinate system fixed in space resulting from differences in expansion rates between the part holder and the substrate on which it is mounted, kinematic mounting is employed. The resulting part holder maintains a constant distance between the reference point and the work piece.

11 Claims, 3 Drawing Sheets

PATTERN GENERATOR PART HOLDER

BACKGROUND OF THE INVENTION

1. Field of the Invention

This invention relates to the field of part holders for holding work pieces in a pattern generation and pattern printing and measuring devices.

2. Background Art

In the photo-lithographic fabrication of integrated circuits, films sensitive to radiant or particle energy are exposed in predetermined patterns to define circuit features. Often, the energy is passed through masks which contain the pattern, selectively exposing this photo resist film on a semiconductor body.

Various methods have been used in the past to generate such masks. For example, the mask patterns can be drawn at a large scale and subsequently photographically reduced to make the final masks. More recently, electron beams have been electrically directed to define patterns on a glass layer to define a mask. In addition to electron beams, lasers are now utilized to fabricate masks by directing the beam across a work piece in such a way as to define the pattern of interest. One such method is described in U.S. patent application No. 758,344 filed July 24, 1985, for "LASER PATTERN GENERATION APPARATUS" and assigned to the assignee of the present invention.

In order to accurately generate masks using a moving work piece and stationery beam, it is necessary to be able to determine the position of the piece relative to the beam in an xy plane. One method of determining the relative position of the work piece is differential interferometry and is decribed in the above referenced patent application. In differential interferometry, a signal is sent (in this case a laser beam) from a fixed source to mirrors mounted on the part holder and on the beam's lens. The signals are reflected back to a receiver near the fixed source and compared, enabling the calculation of relative distance between beam and part. In some applications, a differential interferometry assembly is mounted on each of the x and y axes to measure translational movement in those directions.

One problem with differential interferometry schemes is the inability to present a constant relationship between the work piece and a mirror used to indicate the position of the work piece. This limits the accuracy of the differential interferometry system. The part holder, which holds the work piece, is subject to thermal linear expansion. If a reference mirror is mounted on the part holder as well, the distance between the mirror and any point on the work piece will vary with temperature.

In the past, various solutions to this problem have been attempted. For example, the pattern generation apparatus has been maintained in a temperature controlled environment to eliminate linear thermal expansion. This method has the disadvantages of higher operating costs to maintain a constant temperature as well as incomplete environmental control which can result in significant residual errors.

Therefore, it is an object of the present invention to provide a means of maintaining a constant distance between a work piece and a reference point fixed in space with respect to the part holder and the reference mirrors used for measurement.

It is another object of the present invention to provide a part holder which will operate over a broad temperature range.

It is yet another object of the present invention to provide a means of eliminating translational variations resulting from differences in expansion characteristics at the part holder/substrate interface.

It is a further object of the present invention to eliminate measurement errors known as Abbe offset errors which result when measurements of features are made in a plane other than the plane which contains those features.

It is a still further object of the present invention to provide a part holder which is easily manufacturable.

SUMMARY OF THE PRESENT INVENTION

The present invention provides a part holder for use in a pattern generation apparatus and more generally any printing apparatus having a fixed reference point which then has a constant spatial relationship between itself and a work piece mounted on the part holder. In turn the reference mirrors (measurement) have a constant spatial relationship with respect to this reference point. The result is a constant spatial relationship between the work piece and the reference mirrors. The part holder is comprised of a material having a low coefficient of thermal linear expansion. For ease of construction, the part holder is formed in sections combined by bonding with a suitable adhesive, such as low out-gassing epoxy. However, single piece construction may be utilized as well. In order to eliminate translational variations and other distortion which can result from differences in expansion rates between the part holder and the substrate on which it is mounted, kinematic mounting is employed. The resulting part holder maintains a constant relationship between the reference point, the work piece and the reference mirrors.

DETAILED DESCRIPTION OF THE PRESENT INVENTION

A part holder used in conjunction with a pattern generation device which allows accurate referencing of a work piece mounted on the part holder with respect to the writing lens is described. In the following description numerous specific details are set forth, such as the material composition, etc., in order to provide a more thorough understanding of the present invention. It will be obvious, however, to one skilled in the art, that the present invention can be practiced without these specific details. In other instances, well known structures have not been shown in detail in order not to unnecessarily obscure the present invention.

Figure 1:
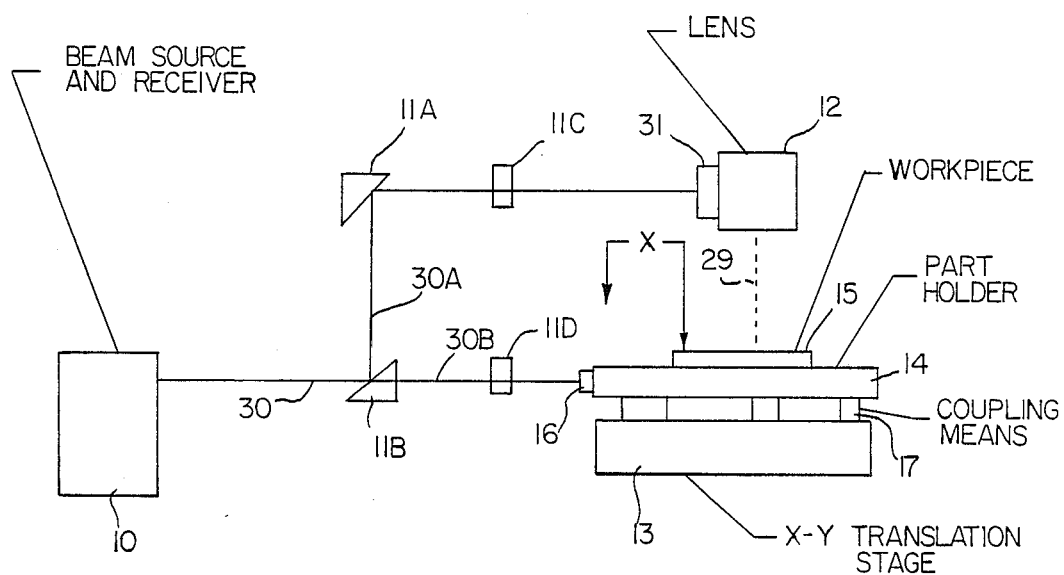
FIG. 1 illustrates the use of differential interferometry in conjunction with a prior art part holding system.

FIG. 1 illustrates the use of differential interferometry to determine the relative position of the writing beam lens to the mounted work piece. The differential interferometry system consists of a beam source and receiver 10, beam splitter 11B and turning mirror 11A and mirrors 16 and 31. The apparatus consists of an x - y translation stage 13, a part holder 14, coupling means between the part holder and the translation stage 17, and a work piece 15. The work piece is written on via beam 29 from the writing lens 12.

The typical translation stage generally allows motion along the three mutually perpendicular axes of a standard cartesian coordinate reference frame. Usually the x y plane is oriented horizontally and allows for large motions of the part (also horizontally oriented). Motion along the z axis (colinear with beam 29) is usually small and allows for focusing of the beam 29 on the part and for leveling the part with respect to beam 29. The result is that the beam and part can be brought into and maintained in a desired spatial relationship.

The part holder 14 has calibration marks formed in or attached to the surface thereof. The marks have a known displacement from a pattern origin. To initialize the operation of the system, the writing beam 29 is placed over one of the calibration marks. The reflection of the mark can be sensed by the optical system of the pattern generation system. This provides accurate data on the relative position of the pattern origin and beam. When the workpiece is moved either in the x or y direction, accurate position data is available by use of the differential interferometry system of the present invention.

Mirrors 16 and 31 are mounted on the translation stage 13 and lens 12 respectively. A beam of light 30 is projected by the differential interferometer 10 to the beam splitter 11B. Beam 30 is split into two components 30B and 30A. Beam 30B is projected through quarter wave plate 11D onto mirror 16. Beam 30A is projected to turning mirror 11A and through quarter wave plate 11C onto mirror 31 of lens 12. Quarter wave plates 11C and 11D polarize (rotate) the light beams 30A and 30B respectively. This conditions the beams so that they can be differentiated by differential interferometer 10. Beam 30A and 30B are thus polarized 90 degrees with respect to each other. The two beams are reflected off mirrors 31 and 16 respectively and back to beam splitter 11B and eventually to the receiver 10. This receiver measures the doppler shift between the beams and thus determines the relative movement of the part holder 14 with respect to the lens 12.

However, the ultimate purpose of the differential interferometer is to reference the position of the beam 29 with respect to the work piece 15. This can only be achieved if there is a constant distance x between the mirror 16 and the work piece 15. In some prior art part holders, linear thermal expansion of the translation stage causes this distance to vary, so that differential interferometer readings do not give a true representation of the position of beam 29 with respect to work piece 15.

The present invention provides a part holder in which a constant relationship may be maintained between a reference mirror and a work piece mounted on the part holder. This is achieved by using a material having a low coefficient of linear thermal expansion, utilizing mirrors mounted directly on the part holder and kinematic mounting of the part holder to the x-y translation stage to eliminate the sensitivity to lateral movement of the part holder relative to the stage and to eliminate the effect of differential expansion distortions to the part holder both of which can result from thermal expansion.

Figure 3:
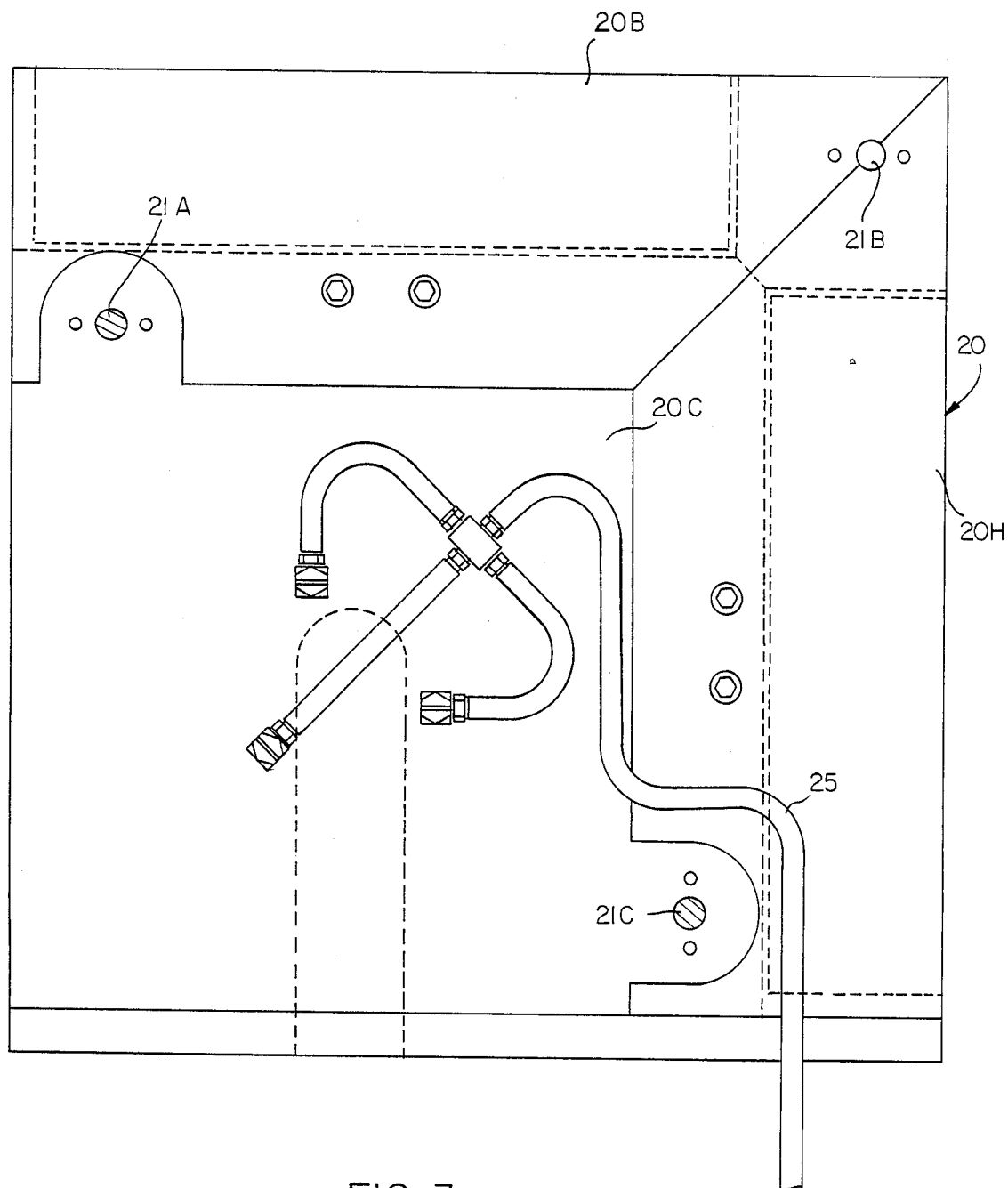
FIG. 3 is a bottom view of the part holder of the present invention.

The part holder of the preferred embodiment of the present invention is illustrated in FIG. 3. For ease of construction, the part holder 20 is fabricated from 3 sections, 20a, 20b and 20c although single piece construction may be utilized if desired. It will be obvious, to one skilled in the art, that any number of pieces may be utilized to construct the part holder of the present invention without departing from the scope of the present invention. In the preferred embodiment of the present invention, the part holder is comprised of ZERODUR, a two phase glass ceramic having a low coefficient of thermal expansion. The typical operating temperature range in a pattern generation system is between 65 and 76 degrees farenheit. In that temperature range, the coefficient of thermal expansion of ZERODUR is plus or minus $0.05 \times 10^{-6}$ inches per inch per degree Kelvin.

In the preferred embodiment of the present invention, the separate pieces of the part holder 20 are bonded by using a low out-gassing epoxy. Because the dimensions of the epoxy layer are very small when compared with the total dimensions of the part holder 20, the orientation of the bond lines, and the large difference in stiffness between the ceramic material, it is not necessary for the epoxy to have special expansion properties.

A work piece is held on the part holder 20 of the present invention by utilizing vacuum apparatus comprised of feed line 25 and a plurality of suction openings 26. In operation, a work piece, comprised of a glass plate with photo sensitive resist is placed on the part holder over the openings 26 and vacuum is applied to hold the device in place.

Referring to FIG. 1, the beam 29 maintains a known spatial relationship with respect to the lens 12 so that if the position of the lens 12 is known, the position of the beam 29 is also known. By mounting mirror 31 on lens 12 so that a fixed spatial relationship exists at all times between lens 12 and mirror 31, the position of the beam 29 relative to mirror 31 can at all times be determined. Therefore, relative motion of beam 29 with respect to a second object whose position is also known, may be determined.

In the present application, it is desired to compare the relative motion of the beam 29 with the workpiece 15. In order to accurately measure the relative motion between the beam 29 and the work piece 15, the present invention employs a mirror 16 mounted on and integral with the part holder 20 itself. As noted above, there must be a fixed spatial relationship between the reference mirror 16 and the work piece 15. By utilizing ZERODUR or other low thermal expansion material for the part holder 20, the spatial relationship between mirror 16 and the work piece may be fixed.

One advantage of having the mirrors mounted directly on the part holder 20 is that the reference mirrors can be positioned such that the plane of the measurement coordinate system are in the same plane as the workpiece itself. This eliminates Abbe offset errors which are introduced in any measuring system as a result of the desired object, e.g. the workpiece, being in a different plane than the plane of the measurement coordinate system.

As used in conjunction with a pattern generator, the part holder 20 is moved by the x y translation stage under the beam 29 such that a pattern is created on the work piece 15. Due to the apparatus of the present invention, the differential measuring scheme may be utilized to detect motion of either the stage or the beam and act upon such motion such that accurate patterns may result.

Figure 2:
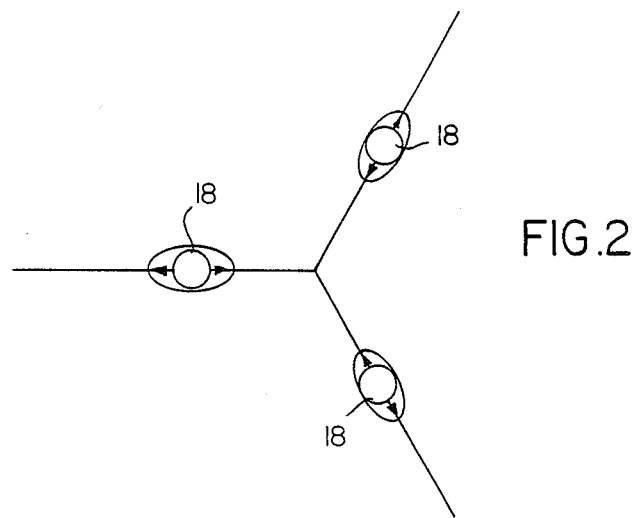
FIG. 2 illustrates the kinematic mounting scheme of the present invention.
Figure 4:
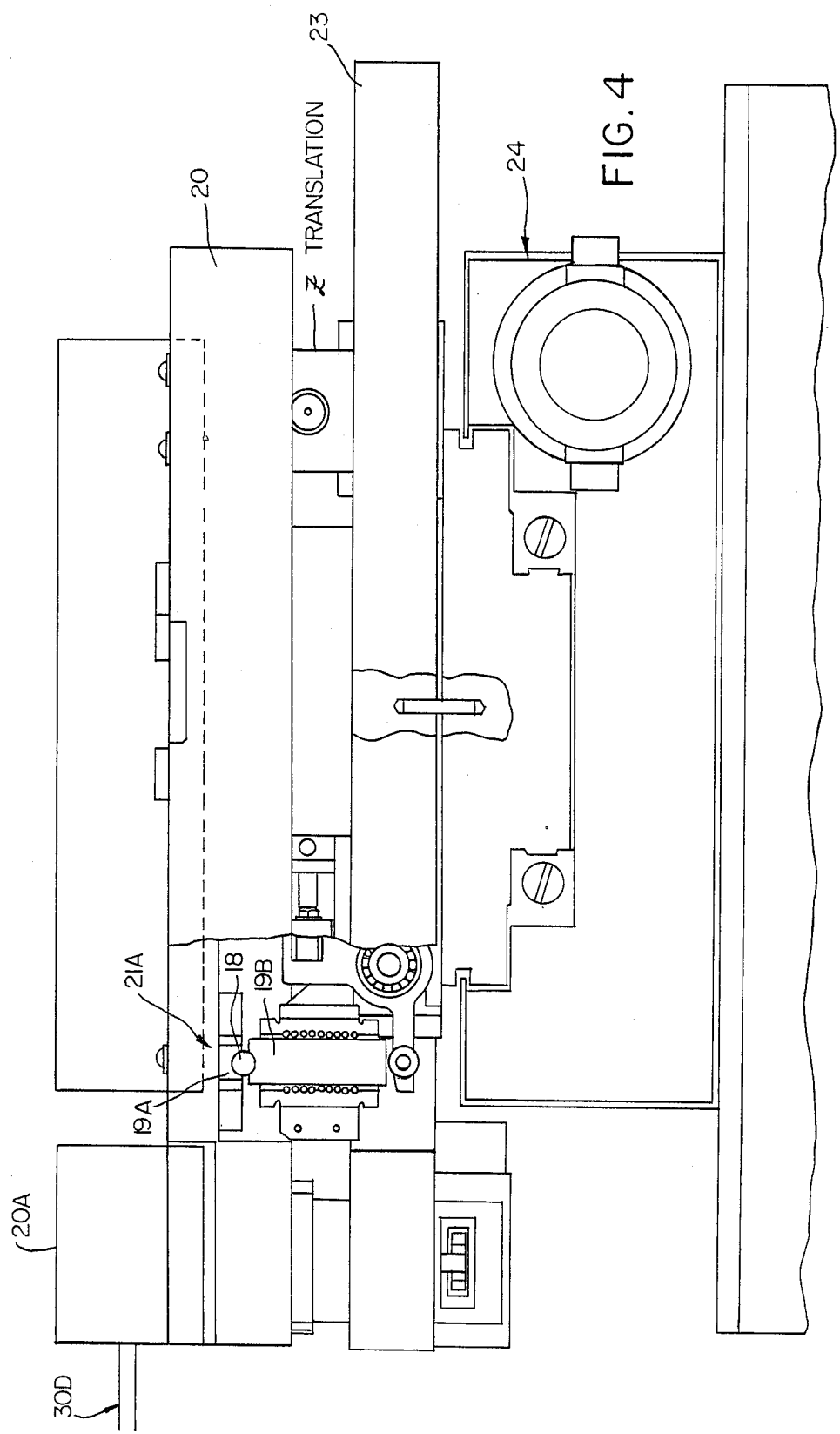
FIG. 4 is a side view of the part holder of FIG. 3.

In order to eliminate the effects of linear thermal expansion of the translation stage, the part holder 20 is isolated from the translation stage by unique mounting means. Referring to FIG. 3, the part holder 20 of the present invention is mounted through means of kinematic mounting 21A, 21B and 21C to the x-y translation stage 23 (FIG. 4) of the present invention. The operation of kinematic mounting can best be described by referring to FIG. 4. In the preferred embodiment of the present invention, the kinematic mount comprises three identical constituents, each of which includes a bearing 18 disposed between a channel 19A and mating cone 19B. Cone 19B is mounted to the x-y translation stage 23 while channel 19A is mounted to the part holder 20. The kinematic mount constituents are disposed at 120 degrees to each other as shown in FIG. 2. In this manner, the effect of linear thermal expansion of the translation stage on the part holder, mounted on the kinematic mounts, is resolved equally in three directions so that the part holder 20 remains in the same absolute location in space. In this manner, the relative distance and orientation between the mirrors mounted on the part holder of the present invention and the workpiece mounted on the part holder of the present invention is maintained in a constant relationship. This allows accurate referencing of the work piece mounted on the part holder.

Thus, a novel part holder which allows for accurate referencing of a pattern generation or measuring pointer beam to a work piece has been described.

I claim:

1. An apparatus for positioning a work piece, said apparatus comprising:
   support means for supporting said work piece, wherein said support means includes one or more reference planes for establishing a desired position of said work piece along at least two orthogonal coordinate directions;
   wherein said reference planes are comprised of a reflective surface mounted on said support means and perpendicular to a corresponding coordinate direction;
   substrate means for introducing translational movement to said work piece;
   coupling means for coupling said support means to said substrate means such that thermal expansion of said substrate means is isolated said support means.

2. The apparatus of claim 1 wherein said coupling means comprises a plurality of kinematic mounts.

3. The apparatus of claim 2 wherein each of said kinematic mounts comprises a groove mated to a ball and cone assembly.

4. The apparatus of claim 1 wherein said support means comprises a material having a coefficient of thermal linear expansion in the range of plus or minus $0.05 \times 10^{-6}$ inches per inch per degree Kelvin.

5. In a system including a part holder for holding a workpiece, said workpiece mounted on a translation stage, and a lens for directing a writing beam onto said workpiece, apparatus for determining the position of said writing beam relative to said workpiece, said apparatus comprising:
   a first mirror mounted on said lens;
   a second mirror mounted on said part holder;
   a differential interferometer for directing a beam of light to said first and second mirrors, said differential interferometer receiving the reflections of said beams of light from said first and second mirrors and determining the relative position of said first mirror with respect to said second mirror;
   kinematic mounting means for coupling said part holder to said translation means, said kinematic mounts for eliminating the effect of linear thermal expansion of said translation means on said part holder wherein the absolute position of said work piece is not effected by thermal size changes of the translation means;
   whereby the position of said writing beam on said workpiece can be accrurately determined.

6. The apparatus of claim 5 wherein said part holder is comprised of a material having a coefficient of thermal linear expansion in the range of plus or minus $0.05 \times 10^{-6}$ inches per inch per degree Kelvin.

7. The apparatus of claim 5 wherein said part holder comprises ZERODUR.

8. The apparatus of claim 5 wherein said kinematic mounting scheme comprises varying means disposed between a channel coupled to said part holder and a cone coupled to said translation means.

9. The apparatus of claim 5 wherein said kinematic mounts comprise three mounts disposed at 120 degrees one to each other.

10. The apparatus of claim 5 wherein said part holder comprises a plurality of parts bonded together by a low out-gassing epoxy.

11. The apparatus of claim 5 wherein said part holder comprises a single unit.

* * * * *

UNITED STATES PATENT AND TRADEMARK OFFICE
CERTIFICATE OF CORRECTION

PATENT NO. : 4,758,091

DATED : 07/19/88

INVENTOR(S) : Bodine

It is certified that error appears in the above-identified patent and that said Letters Patent is hereby corrected as shown below:

ON THE TITLE PAGE:

[73] Assignee delete "Ateo" insert--Ateq--

Signed and Sealed this

Tenth Day of October, 1989

Attest:

DONALD J. QUIGG

Attesting Officer

Commissioner of Patents and Trademarks